US012804827B2

(12) United States Patent
Ryu et al.

(10) Patent No.: US 12,804,827 B2
(45) Date of Patent: Nov. 17, 2026

(54) DISPLAY DEVICE INCLUDING FINGERPRINT DETECTION SENSOR

(71) Applicant: Samsung Display Co., LTD., Yongin-si (KR)

(72) Inventors: Ji Hun Ryu, Yongin-si (KR); Woo Young Kim, Yongin-si (KR); Yun Ha Kim, Yongin-si (KR); Bon Joo Koo, Yongin-si (KR); Jae Young Yu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 125 days.

(21) Appl. No.: 18/447,821

(22) Filed: Aug. 10, 2023

(65) Prior Publication Data

US 2024/0147642 A1 May 2, 2024

(30) Foreign Application Priority Data

Oct. 26, 2022 (KR) ........................ 10-2022-0139701

(51) Int. Cl.
*H05K 5/02* (2006.01)
*G06F 1/16* (2006.01)
(Continued)

(52) U.S. Cl.
CPC ......... *H05K 5/0217* (2013.01); *G06F 1/1652* (2013.01); *G06V 40/13* (2022.01);
(Continued)

(58) Field of Classification Search
CPC .. H05K 5/0217; H05K 1/0283; H05K 9/0054; H05K 2201/10151;
(Continued)

(56) References Cited

U.S. PATENT DOCUMENTS 7,105,931 B2 * 9/2006 Attarwala ............... H01L 24/86 257/E23.101
10,067,229 B2 * 9/2018 Djordjev ............. G01S 7/52079
(Continued)

FOREIGN PATENT DOCUMENTS

KR 10-2019-0026476 A 3/2019
KR 10-2019-0080106 A 7/2019
(Continued)

*Primary Examiner* — Allen L Parker
*Assistant Examiner* — Martin Antonio Asmat Uceda
(74) *Attorney, Agent, or Firm* — Womble Bond Dickinson (US) LLP

(57) ABSTRACT

In a display device including unfoldable areas and a foldable area between the unfoldable areas, the display device includes: a window; a display panel under the window; a fingerprint detection sensor configured to generate signals for fingerprint recognition in a direction toward the display panel in any one of the unfoldable areas; a first support member supporting the display panel under the display panel and between the display panel and the fingerprint detection sensor; a second support member supporting the display panel under the first support member and having an opening overlapping the fingerprint detection sensor; and a reinforcing member overlapping the opening of the second support member and between the first support member and the fingerprint detection sensor, wherein the reinforcing member includes glass.

18 Claims, 12 Drawing Sheets

(51) Int. Cl.
*G06V 40/13* (2022.01)
*G09F 9/30* (2006.01)
*H10K 102/00* (2023.01)

(52) U.S. Cl.
CPC ...... *G06V 40/1306* (2022.01); *G06V 40/1329* (2022.01); *G09F 9/301* (2013.01); *H10K 2102/311* (2023.02)

(58) Field of Classification Search
CPC ............... G06V 40/1329; G06V 40/13; G06V 40/1306; G06F 1/1652; G06F 1/1641; G06F 1/1684; G06F 1/16; G09F 9/301; H10K 2102/311; H10K 59/60
See application file for complete search history.

(56) References Cited

U.S. PATENT DOCUMENTS

| | | | | |
|---|---|---|---|---|
| 10,074,824 | B2 * | 9/2018 | Han | H10K 59/87 |
| 10,409,099 | B2 * | 9/2019 | Hsiao | G06V 40/1318 |
| 10,445,547 | B2 * | 10/2019 | Tsai | G10K 11/30 |
| 10,488,693 | B2 * | 11/2019 | Lee | G06F 1/1686 |
| 10,671,829 | B2 * | 6/2020 | Lee | H10K 59/8792 |
| 10,691,921 | B2 * | 6/2020 | Seo | G06V 40/40 |
| 10,796,125 | B2 * | 10/2020 | Gong | G06V 40/1306 |
| 10,929,635 | B2 * | 2/2021 | Kwon | H05K 1/189 |
| 11,080,502 | B2 * | 8/2021 | Lee | G06F 1/203 |
| 11,126,814 | B2 * | 9/2021 | Lu | G06F 21/32 |
| 11,432,410 | B2 | 8/2022 | Woo et al. | |
| 11,460,957 | B2 * | 10/2022 | Jennings | G06V 40/1306 |
| 11,475,698 | B2 * | 10/2022 | Kim | G06V 40/1318 |
| 11,544,955 | B2 * | 1/2023 | Been | G06V 40/1376 |
| 11,798,307 | B2 * | 10/2023 | Lin | G06F 21/32 |
| 2011/0267298 | A1 * | 11/2011 | Erhart | G06F 21/32 345/173 |
| 2017/0323133 | A1 * | 11/2017 | Tsai | G06V 40/1329 |
| 2018/0120893 | A1 * | 5/2018 | Browning | G06F 3/165 |
| 2018/0314096 | A1 * | 11/2018 | Yang | G06F 1/1684 |
| 2018/0341290 | A1 * | 11/2018 | Sim | G06V 10/17 |
| 2018/0373913 | A1 * | 12/2018 | Panchawagh | G01S 15/8913 |
| 2019/0073505 | A1 * | 3/2019 | Kwon | G01B 11/24 |
| 2019/0087630 | A1 * | 3/2019 | Seo | G06V 40/1329 |
| 2019/0197282 | A1 * | 6/2019 | Gong | G06V 40/1306 |
| 2019/0251320 | A1 * | 8/2019 | Kim | G06V 40/1306 |
| 2019/0294770 | A1 * | 9/2019 | Han | G06V 40/13 |
| 2019/0303640 | A1 * | 10/2019 | Song | G06V 40/1312 |
| 2020/0134278 | A1 * | 4/2020 | Lee | H05K 9/0054 |
| 2020/0143133 | A1 * | 5/2020 | Moon | G06F 3/0446 |
| 2021/0318726 | A1 * | 10/2021 | Cho | H04M 1/0249 |
| 2021/0326569 | A1 * | 10/2021 | Song | G06F 1/1681 |
| 2022/0114923 | A1 | 4/2022 | Ha et al. | |
| 2022/0183174 | A1 * | 6/2022 | Bae | G06F 1/1641 |
| 2022/0238850 | A1 * | 7/2022 | Zheng | G06V 40/1318 |
| 2024/0184333 | A1 * | 6/2024 | Fu | G06F 1/1656 |
| 2024/0329448 | A1 * | 10/2024 | Zhang | G02F 1/1333 |

FOREIGN PATENT DOCUMENTS

| | | | | |
|---|---|---|---|---|
| KR | 10-2020-0049403 | A | | 5/2020 |
| KR | 20210014812 | A | * | 2/2021 |
| KR | 10-2021-0070880 | A | | 6/2021 |
| KR | 20210086745 | A | * | 7/2021 |
| KR | 20210107205 | A | * | 9/2021 |
| KR | 10-2022-0048500 | A | | 4/2022 |
| KR | 10-2462967 | B1 | | 11/2022 |

* cited by examiner

DISPLAY DEVICE INCLUDING FINGERPRINT DETECTION SENSOR

CROSS-REFERENCE TO RELATED APPLICATION

The present application claims priority to and the benefit of Korean Patent Application No. 10-2022-0139701, filed on Oct. 26, 2022, the entire content of which is incorporated herein by reference.

BACKGROUND

1. Field

Aspects of some embodiments of the present disclosure relate to an electronic device.

2. Description of the Related Art

A display device may include a fingerprint detection sensor capable of recognizing a fingerprint. For example, an electronic device including the display device may be capable of recognizing a fingerprint of a user and managing security of the electronic device according to the recognized fingerprint. On the other hand, a problem in that a size of a bezel of the display device increases according to a position of the fingerprint detection sensor may occur. Accordingly, research on a method of recognizing a fingerprint in a display area by overlapping a fingerprint detection sensor on a display area is being actively conducted.

Meanwhile, demand for a foldable display device is increasing. Differently from a rigid display device, the foldable display device may be bent, folded, or rolled. As described above, the foldable display device may be deformed into various shapes, and thus it may be relatively easy to carry the foldable display device, thereby improving user convenience.

The above-described content is only intended to help understanding of the background of the technical ideas of the disclosure, and thus it cannot be understood as the prior art known to those skilled in the art.

SUMMARY

Aspects of some embodiments of the present disclosure relate to an electronic device, and for example, to a display device including a fingerprint detection sensor.

Various problems may exist when a fingerprint detection sensor is located on a rear surface of a foldable display device. For example, the foldable display device may include ultra-thin glass as a cover window and may further include a support plate for supporting components of the foldable display device under the cover window in consideration of a relatively low rigidity of the cover window. When the fingerprint detection sensor is employed on the rear surface of such a foldable display device, the support plate may not be suitable for passing signals of the fingerprint detection sensor, or deformation of configurations of the foldable display device due to the signals of the fingerprint detection sensor may not be prevented.

Some embodiments of the present disclosure may include a display device having relatively improved reliability. For example, the display device may include a fingerprint detection sensor, signals of the fingerprint detection sensor may be efficiently passed, and deformation of configurations of the display device due to the signals may be prevented or minimized.

According to some embodiments of the present disclosure, a display device including unfoldable areas and a foldable area between the unfoldable areas includes a window, a display panel under the window, a fingerprint detection sensor configured to generate signals for fingerprint recognition in a direction toward the display panel in any one of the unfoldable areas, a first support member supporting the display panel under the display panel and between the display panel and the fingerprint detection sensor, a second support member further supporting the display panel under the first support member and having an opening overlapping the fingerprint detection sensor, and a reinforcing member overlapping the opening of the second support member and between the first support member and the fingerprint detection sensor. The reinforcing member includes glass.

According to some embodiments, the fingerprint detection sensor may include an active area configured to generate the signals for the fingerprint recognition, and the reinforcing member may overlap the entire active area of the fingerprint detection sensor and has an area greater than an area of the active area.

According to some embodiments, the first support member may extend along an extension direction of the display panel without an opening overlapping the fingerprint detection sensor.

According to some embodiments, the first support member and the second support member may include materials different from each other.

According to some embodiments, the first support member may include at least one selected from a group consisting of aluminum alloy, magnesium alloy, titanium alloy, carbon fiber reinforced plastics, and glass fiber reinforced plastics.

According to some embodiments, the second support member may include bodies respectively overlapping the unfoldable areas, and the opening of the second support member may be defined by one of the bodies and may overlap the reinforcing member.

According to some embodiments, the bodies of the second support member may include at least one selected from a group consisting of stainless steel, aluminum alloy, and copper alloy.

According to some embodiments, the window may include ultra-thin glass having a thickness of 100 micrometers or less.

According to some embodiments, the fingerprint detection sensor may include an ultrasonic fingerprint sensor configured to generate ultrasonic signals as the signals.

According to some embodiments, the second support member may extend in a first direction and a second direction crossing the first direction, the reinforcing member may overlap the fingerprint detection sensor in a third direction crossing the first and second directions, the third direction may be the direction toward the display panel, and the reinforcing member may face a body of the second support member defining the opening in the first and second directions.

According to some embodiments, the reinforcing member may have a thickness greater than a thickness of the second support member.

According to some embodiments, the display device may further include a copper thin film layer between the reinforcing member and the fingerprint detection sensor.

According to some embodiments of the present disclosure, a display device including unfoldable areas and a foldable area between the unfoldable areas includes a window, a display panel under the window, a fingerprint detection sensor configured to generate signals for fingerprint recognition in a direction toward the display panel in any one of the unfoldable areas, a first support member supporting the display panel under the display panel and between the display panel and the fingerprint detection sensor, and a second support member further supporting the display panel under the first support member and between the first support member and the fingerprint detection sensor. The first support member and the second support member successively extend along an extension direction of the display panel without an opening in an area overlapping the fingerprint detection sensor.

According to some embodiments, the first support member and the second support member may include the same material as each other.

According to some embodiments, the first support member and the second support member may include aluminum alloy.

According to some embodiments, each of the first support member and the second support member may include at least one selected from a group consisting of aluminum alloy, titanium alloy, magnesium alloy, carbon fiber reinforced plastics, glass fiber reinforced plastics, and stainless steel.

According to some embodiments, the second support member may include bodies respectively overlapping the unfoldable areas, and the fingerprint detection sensor may overlap one of the bodies.

According to some embodiments, the display device may further include a reinforcing member between the second support member and the fingerprint detection sensor, and the reinforcing member may include glass.

According to some embodiments, the fingerprint detection sensor may include an ultrasonic fingerprint sensor configured to generate ultrasonic signals as the signals.

According to some embodiments of the present disclosure, a display device including unfoldable areas and a foldable area between the unfoldable areas includes a window, a display panel under the window, an ultrasonic fingerprint sensor configured to generate ultrasonic signals in any one of the unfoldable areas in a direction toward the display panel, a first support member supporting the display panel under the display panel and between the display panel and the fingerprint detection sensor, a second support member further supporting the display panel under the first support member and having an opening overlapping the fingerprint detection sensor, and a reinforcing member overlapping the opening of the second support member and between the first support member and the fingerprint detection sensor to prevent at least a portion of the display device from being deformed due to the ultrasonic signals.

According to some embodiments of the disclosure, a display device having improved reliability is provided.

Characteristics of embodiments according to the present disclosure are not limited by the content described above, and more various effects are included in the present specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1A:
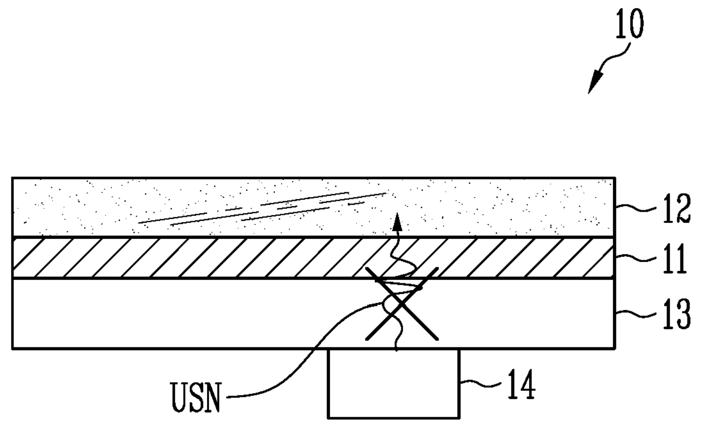
FIG. 1A is a cross-sectional view of a display device according to some embodiments.

Embodiments according to the present disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. In the following description, the singular expressions include plural expressions unless the context clearly dictates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance.

The advantages and features of the disclosure and a method of achieving them will become apparent with reference to the embodiments described in detail later together with the accompanying drawings. However, the disclosure is not limited to the embodiments disclosed below, and may be implemented in various different forms. In the following description, a case where a portion is connected to another portion includes a case where they are electrically connected to each other with another element interposed therebetween as well as a case in which they are directly connected to each other. According to some embodiments of the disclosure, a term "connection" between two configurations may mean that both of an electrical connection and a physical connection are inclusively used.

FIG. 1A is a cross-sectional view illustrating a display device according to some embodiments.

Referring to FIG. 1A, the display device 10 may include a display panel 11, a cover window 12, and a support plate 13.

The display panel 11 is configured to generate or display images. The cover window 12 may cover the display panel 11 to protect the display panel 11. When the display device 10 is a foldable display device, the cover window 12 may include materials and properties suitable for folding the cover window 12. For example, the cover window 12 may include a glass substrate and/or a synthetic resin film. For example, the cover window 12 may have a relatively low thickness, for example, a thickness equal to or less than 100 micrometers. As described above, the cover window 12 may have a thickness relatively thinner or less than that of a cover window employed in an unfoldable (or flat) display device, and thus the cover window 12 may have relatively low rigidity. Considering the relatively low rigidity of the cover window 12, the display device 10 may include the support plate 13 supporting configurations of the display device 10 such as the display panel 11 at a lower portion of the display device 10.

The support plate 13 may include a relatively high rigidity material such as stainless steel to support the configurations of the display device 10 and may have a relatively thick thickness. When an ultrasonic fingerprint sensor 14 is located under the display device 10 to provide a function of detecting a fingerprint of a user, ultrasonic signals USN output from the ultrasonic fingerprint sensor 14 may not pass through the support plate 13. For example, as described above, the support plate 13 may include the relatively high rigidity material and have the relatively thick thickness, and thus the support plate 13 may have a relatively high acoustic impedance. Therefore, the ultrasonic signals USN of the ultrasonic fingerprint sensor 14 may not pass through the support plate 13.

Figure 1B:
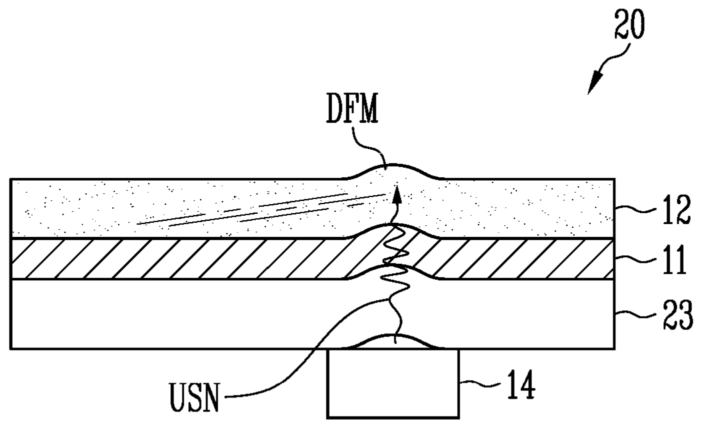
FIG. 1B is a cross-sectional view of a display device according to some embodiments.

FIG. 1B is a cross-sectional view illustrating a display device according to some embodiments.

Referring to FIG. 1B, the display device 20 may include the display panel 11, the cover window 12, a support plate 23, and the ultrasonic fingerprint sensor 14.

The support plate 23 may include a material different that of the support plate 13 of FIG. 1A. For example, the support plate 13 may include a material suitable for passing the ultrasonic signals USN output from the ultrasonic fingerprint sensor 14, such as carbon fiber reinforced plastics or titanium alloy. In this case, the support plate 23 may have a relatively low rigidity (or modulus) compared to the support plate 13 of FIG. 1A, and this may cause deformations DFM of at least some of the configurations 11, 12, and 23 of the display device 20. Reliability of an operation of the display device 20 may decrease due to the deformations DFM. In addition, when an upper layer of the display device 20, such as the cover window 12, is deformed, the deformations DFM may be recognized by the user.

Figure 2:
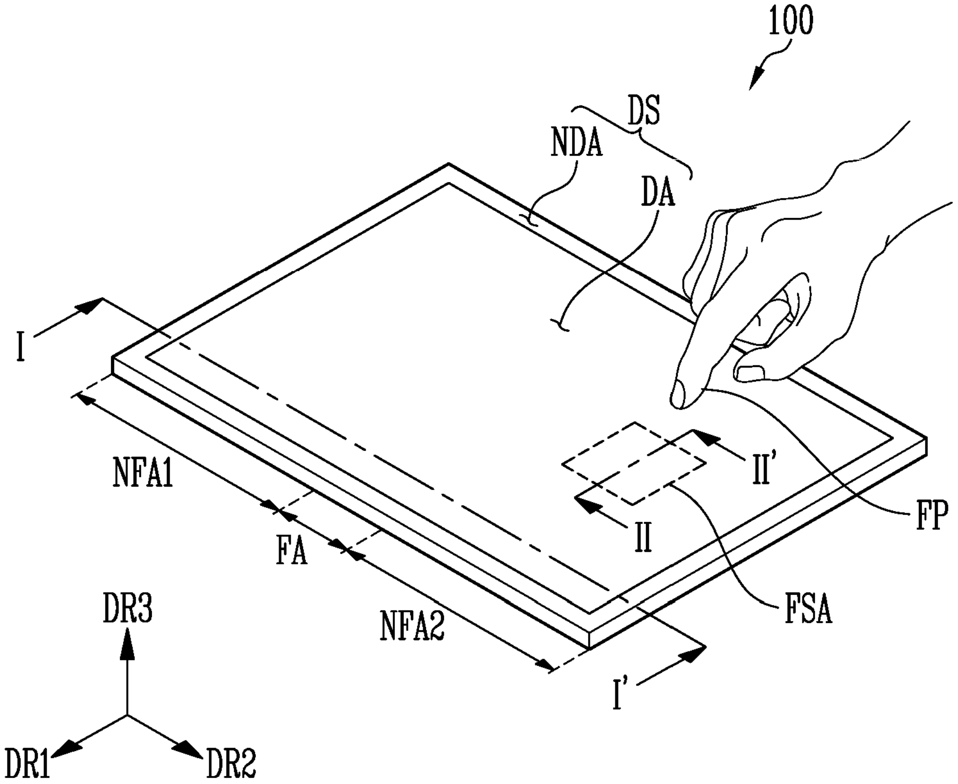
FIG. 2 is a perspective view illustrating a display device in an unfolded state according to some embodiments.
Figure 3:
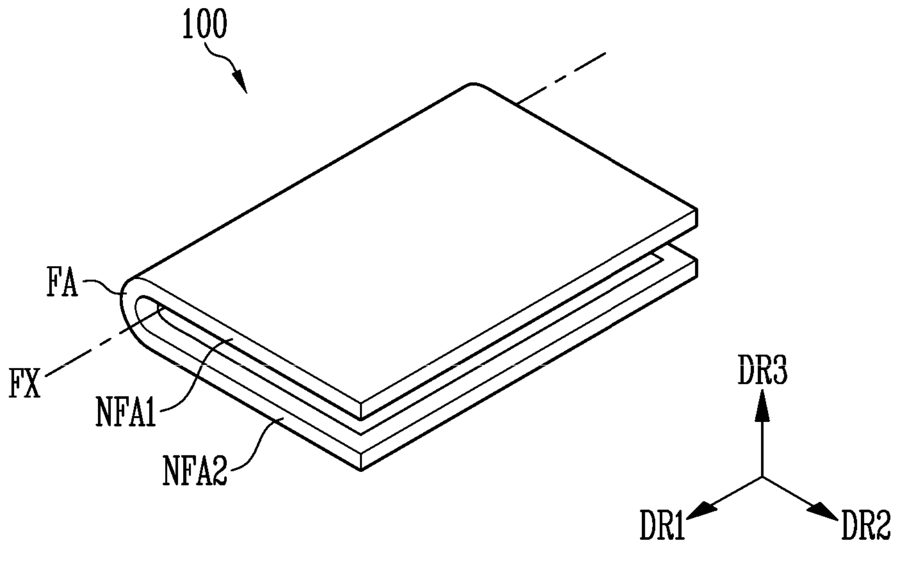
FIG. 3 is a perspective view illustrating the display device of FIG. 2 in a folded state according to some embodiments.

FIG. 2 is a perspective view illustrating a display device in an unfolded state according to some embodiments of the present disclosure. FIG. 3 is a perspective view illustrating the display device of FIG. 2 in a folded state.

Referring to FIGS. 2 and 3, the display device 100 may be a foldable display device. The display device 100 according to some embodiments may be used in a large-sized electronic device such as a televisions and a monitor, and a small and medium-sized electronic device such as a mobile phone, a tablet, a car navigation system, a game console, and a smart watch.

An upper surface of the display device 100 may be defined as a display surface DS, and in an unfolded state, in other words, in a state in which the display device 100 is flat, the display surface DS may have a plane defined by a first direction DR1 and a second direction DR2.

The display surface DS may include a display area DA and a non-display area NDA around the display area DA. The display area DA is an area where an image is displayed, and the non-display area NDA is an area where images are not displayed.

In embodiments, the display area DA may have a quadrangular shape. The non-display area NDA may at least partially surround the display area DA. However, embodiments are not limited thereto, and shapes of the display area DA and the non-display area NDA may be variously modified.

The display device 100 may include a first unfoldable area NFA1, a foldable area FA, and a second unfoldable area NFA2 sequentially defined (or arranged) in the second direction DR2 or in a direction opposite to the second direction DR2. For example, the foldable area FA may be located between the first unfoldable area NFA1 and the second unfoldable area NFA2. In FIGS. 2 and 3, one foldable area FA and two unfoldable areas NFA1 and NFA2 are shown, but embodiments according to the present disclosure are not limited thereto. For example, the display device 100 may include more than two unfoldable areas and foldable areas located between the unfoldable areas.

The display device 100 may be folded based on a folding axis FX. The foldable area FA may be bent based on the folding axis FX. The folding axis FX may be defined as a minor axis parallel to a short side of the display device 100. For example, the folding axis FX may extend along the first direction DR1.

The display device 100 may be folded inwardly based on the folding axis FX. In this case, when the display device 100 is folded, a display surface of the first unfoldable area NFA1 and a display surface of the second unfoldable area NFA2 may face each other. However, embodiments according to the present disclosure are not limited thereto. For example, the display device 100 may be folded outwardly based on the folding axis FX. In this case, when the display device 100 is folded, the display surface of the first unfoldable area NFA1 and the display surface of the second unfoldable area NFA2 may face opposite directions.

The display device 100 may include a fingerprint detection area FSA. The display device 100 may include a fingerprint detection sensor overlapping the fingerprint detection area FSA under the display surface DS, and the fingerprint detection sensor may be installed so that an active area of fingerprint detection sensor faces the display surface DS or the upper surface of the display device 100. Accordingly, the fingerprint detection sensor may recognize a fingerprint FP of the user adjacent to the fingerprint detection area FSA. The fingerprint detection sensor may include an ultrasonic fingerprint sensor configured to generate ultrasonic signals through the active area, detect ultrasonic signals received by reflecting the generated ultrasonic signals on the fingerprint FP of the user, and recognize the fingerprint FP of the user based on the detected ultrasonic signals.

According to some embodiments, the fingerprint detection area FSA may overlap any one of the first and second unfoldable areas NFA1 and NFA2.

Figure 4:
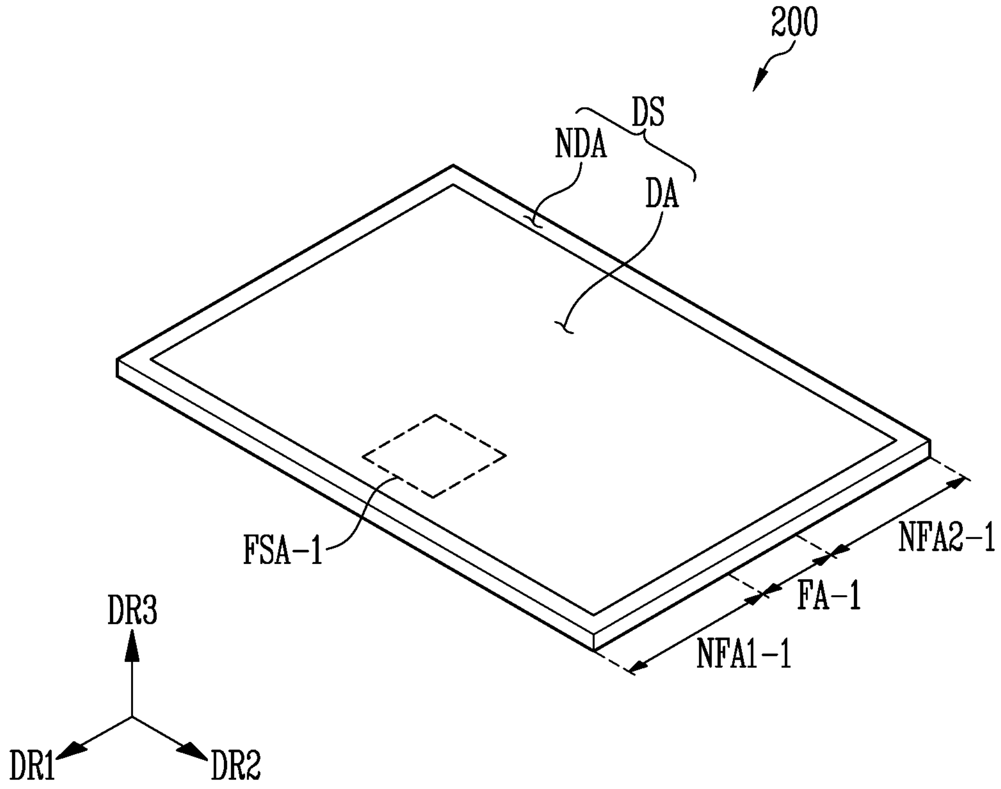
FIG. 4 is a perspective view illustrating a display device in an unfolded state according to some embodiments.
Figure 5:
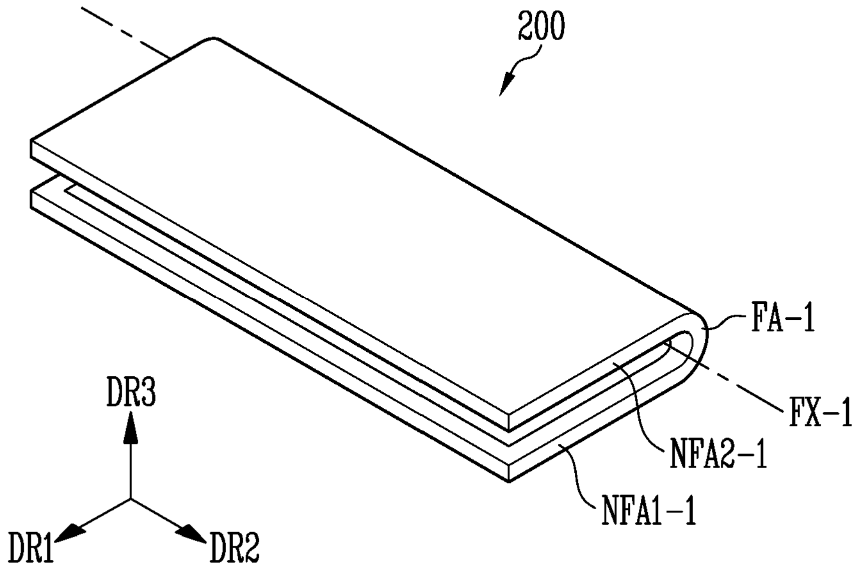
FIG. 5 is a perspective view illustrating the display device of FIG. 4 in a folded state according to some embodiments.

FIG. 4 is a perspective view illustrating a display device in an unfolded state according to some embodiments of the present disclosure. FIG. 5 is a perspective view illustrating the display device of FIG. 4 in a folded state.

Referring to FIGS. 4 and 5, the display device 200 may include a first unfoldable area NFA1-1, a foldable area FA-1, and a second unfoldable area NFA2-1 sequentially defined (or arranged) in a first direction DR1 or a direction opposite to the first direction DR1. The foldable area FA-1 may be located between the first unfoldable area NFA1-1 and the second unfoldable area NFA2-1.

The display device 200 may include a fingerprint detection area FSA-1 overlapping any one of the first and second unfoldable areas NFA1-1 and NFA2-1. The display device 200 may include a fingerprint detection sensor overlapping the fingerprint detection area FSA-1 under the display surface DS, and the fingerprint detection sensor may be installed so that an active area of the fingerprint detection sensor faces the display surface DS or the upper surface of the display device 200. In embodiments, the fingerprint detection sensor may include an ultrasonic fingerprint sensor.

The display device 200 may be folded based on a folding axis FX-1. The foldable area FA-1 may be bent based on the folding axis FX-1. According to some embodiments, the folding axis FX-1 may be defined as a major axis parallel to a long side of the display device 200. For example, the folding axis FX-1 may extend along the second direction DR2.

As described above, the display device may include a folding axis aligned along one of various directions, such as the folding axis FX of FIG. 3 and the folding axis FX-1 of FIG. 5, and may be folded based on the folding axis. Hereinafter, structures of the display device 100 of FIGS. 2 and 3 folded based on a minor axis are described. However, embodiments according to the present disclosure are not limited thereto. For example, the structures of the display device 100 to be described below may also be applied to the display device 200 folded based on a major axis.

Figure 6:
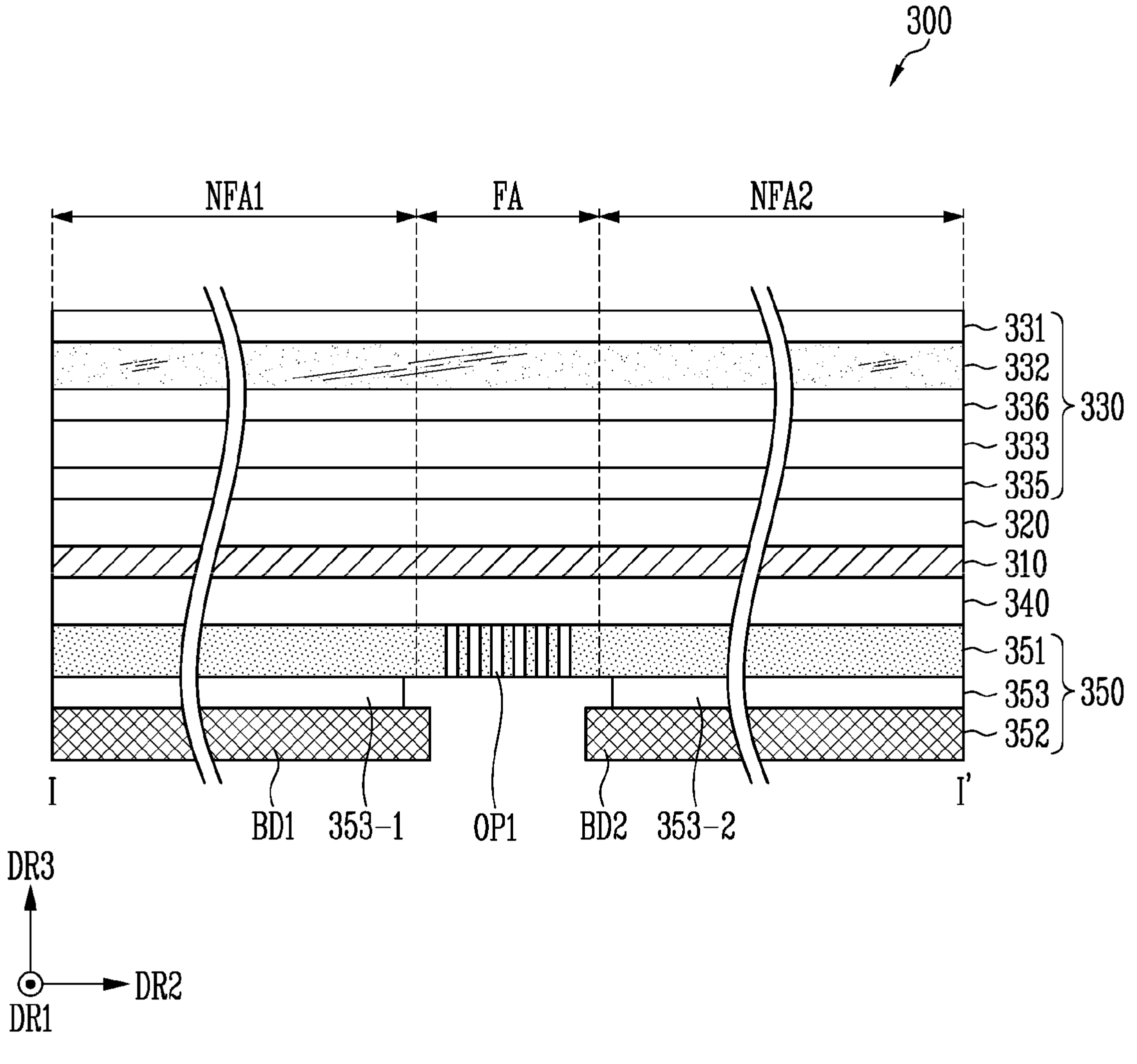
FIG. 6 is a cross-sectional view of the display device of FIG. 2 taken along a line I-I' according to some embodiments.
Figure 7:
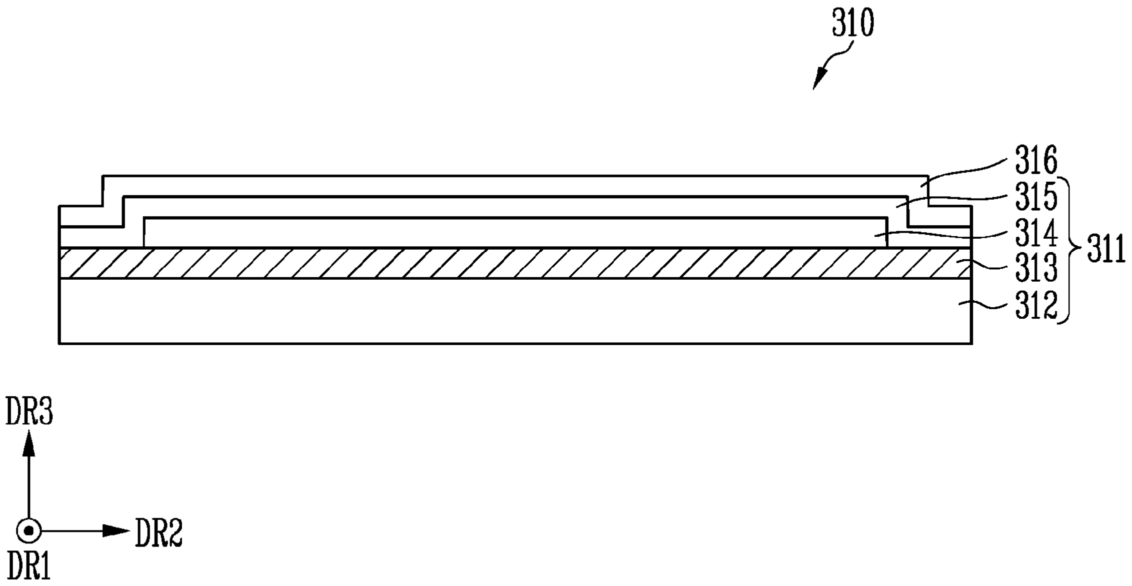
FIG. 7 is a cross-sectional view of a display panel of FIG. 6 according to some embodiments.

FIG. 6 is a cross-sectional view of the display device of FIG. 2 taken along a line I-I' according to some embodiments. FIG. 7 is a cross-sectional view of the display panel of FIG. 6.

Referring first to FIG. 6, the display device 300 may include a display panel 310, an anti-reflection member 320, an upper member 330, a lower protective film 340, and a lower member 350.

The display panel 310 may be configured to generate an image and detect an input received from an outside. Referring to FIG. 7, the display panel 310 may include a display layer 311 and a sensor layer 316.

The display layer 311 is configured to generate images. The display layer 311 may be a light emitting display layer. For example, the display layer 311 may be an organic light emitting display layer, a quantum dot display layer, or a micro LED display layer. According to a structure of the display layer 311, the display panel 310 may be an organic light emitting display panel, a quantum dot display panel, or a micro LED display panel.

The display layer 311 may include a base layer 312, a circuit layer 313, a light emitting element layer 314, and an encapsulation layer 315.

The base layer 312 may include a substrate. The substrate may include a glass substrate, an organic/inorganic composite substrate, or the like. The base layer 312 may include a synthetic resin layer. The synthetic resin layer may include a thermosetting resin. The base layer 312 may have a multilayer structure. For example, the base layer 312 may include a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. According to some embodiments, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin.

The circuit layer 313 may be located on the base layer 312. The circuit layer 313 may include a plurality of layers for driving the light emitting element layer 314, such as semiconductor patterns, conductive patterns, signal lines, and insulating layers. For example, the semiconductor patterns and the conductive patterns may include pixel circuits for driving light emitting elements of the light emitting element layer 314, and such pixel circuits may be controlled through signal lines.

The light emitting element layer 314 may be located on the circuit layer 313. The light emitting element layer 314 may include the light emitting elements. For example, the light emitting element layer 314 may include an organic light emitting material, a quantum dot, a quantum rod, or a micro LED.

The encapsulation layer 315 may be located on the light emitting element layer 314 to protect configurations of the display layer 311 such as the light emitting element layer 314 from an external environment. The encapsulation layer 315 may include inorganic layers and at least one organic layer. For example, the encapsulation layer 315 may include an inorganic layer, an organic layer, and an inorganic layer sequentially stacked. The inorganic layers may protect the light emitting element layer 314 from moisture and oxygen, and the organic layer may protect the light emitting element layer 314 from a foreign substance such as a dust particle.

The sensor layer 316 may be located on the display layer 311. The sensor layer 316 may detect an external input received from the outside. The external input may be an input of the user. The input of the user may include at least one external input among various forms such as a portion of a user body, light, heat, pen, and pressure.

According to some embodiments, the sensor layer 316 may be directly located on the display layer 311. For example, without a separate adhesive member located between the sensor layer 316 and the display layer 311, the sensor layer 316 may use the configuration of the display layer 311 such as the encapsulation layer 315 as a substrate, to form sensor units of the sensor layer 316 on the substrate. Alternatively, the sensor layer 316 may be formed separately from the display layer 311, and then coupled to the display layer 311 through an adhesive member. The adhesive layer may include an adhesive and/or a viscosity agent. For example, the adhesive layer may include a pressure sensitive adhesive film (PSA), an optically clear adhesive film (OCA), an optically clear resin (OCR), or the like. The adhesive layer described below may include an adhesive and/or a viscosity agent.

Referring to FIG. 6 again, upper functional layers may be located on the display panel 310. The upper functional layers may include an anti-reflection layer 320 and an upper member 330.

The anti-reflection layer 320 is configured to reduce a reflectance of external light incident from the outside. For example, the anti-reflection layer 320 may include a stretchable synthetic resin film. However, this is an example and a material forming the anti-reflection layer 320 is not limited thereto.

According to some embodiments, the anti-reflection layer 320 may include an offset interference structure. For example, the offset interference structure may include a first reflective layer and a second reflective layer located on different layers. First reflection light and second reflection light reflected from the first reflection layer and the second reflection layer, respectively, may be at least partially removed by offset interference with each other, and thus the reflectance of the external light may decrease. According to some embodiments, the anti-reflection layer 320 may include one or more polarizers overlapping each other. According to some embodiments, the anti-reflection layer 320 may include color filters. In addition, the anti-reflection layer 320 may further include a black matrix adjacent to the color filters.

The anti-reflection layer 320 may be directly located on the display panel 310. Alternatively, the anti-reflection layer 320 may be coupled to the display panel 310 through a separate adhesive layer.

The upper member 330 may be located on the anti-reflection layer 320. The upper member 330 may include a protective layer 331, a cover window 332, and an impact absorbing layer 333.

The protective layer 331 may protect configurations located under the protective layer 331. The protective layer 331 may include a hard coating layer, an anti-fingerprint layer, and the like to improve properties such as chemical resistance and abrasion resistance. The protective layer 331 may include a polyimide (PI) film. The protective layer 331 may have a multilayer structure. For example, the protective layer 331 may include a first protective layer, a second protective layer, and an adhesive layer coupling them. For example, the protective layer 331 may include a plurality of synthetic resin films.

The cover window 332 may be located under the protective layer 331. The cover window 332 may be coupled to the protective layer 331 by a separate adhesive layer. The cover window 332 may include an optically transparent insulating material. The cover window 332 may have a multilayer structure or a single layer structure.

As described with reference to FIGS. 2 to 5, the display device 300 is foldable. Accordingly, the cover window 332 may also include materials and properties suitable for it to be foldable. According to some embodiments, the cover window 332 may include glass. In this case, the cover window 332 may have a thickness equal to or less than 100 micrometers or a thickness equal to or less than 80 micrometers so that it is foldable. For example, the cover window 332 may have a thickness of 30 micrometers. The cover window 332 may include ultra-thin glass (UTG). As described above, the cover window 332 has a thickness relatively thinner than that of the cover window employed in an unfoldable (or flat) display device. This may mean that the cover window 332 has relatively low rigidity. Accordingly, the display device 300 may include the lower member 350 to support configurations of the display device 300 compared to an unfoldable display device.

According to some embodiments, the cover window 332 may include a hard coating layer to improve an anti-fouling property, an anti-scratch property, an impact resistance property, and the like.

The impact absorbing layer 333 may be located under the cover window 332. The impact absorbing layer 333 may be coupled to the cover window 332 by an adhesive layer 336. The impact absorbing layer 333 may be a functional layer for protecting the display panel 310 from external impact. The impact absorbing layer 333 may be selected among films having an elastic modulus of 1 GPa or more at room temperature. The impact absorbing layer 333 may be a stretched film having an optical function. For example, the impact absorbing layer 333 may be an optical axis control film.

In embodiments, the impact absorbing layer 333 may have a curved surface at an upper surface and/or a lower surface thereof, and a planarization layer for filling the curved surface at the upper surface and/or the lower surface of the impact absorbing layer 333 may be further provided. Accordingly, haze that may occur on the curved surface of the impact absorbing layer 333 may be prevented or reduced. According to some embodiments, the impact absorbing layer 333 may be omitted. When the impact absorbing layer 333 is omitted, the anti-reflection member 320 may be adhered to the cover window 332.

The upper member 330 may be coupled to the anti-reflection member 320 through an adhesive layer 335. The adhesive layer 335 may include an adhesive and/or a viscosity agent. It may be understood that adhesive layers 335 and 336 are included in the upper member 330.

Lower functional layers may be located under the display panel 310. The lower functional layers may include the lower protective film 340 and the lower member 350.

The lower protective film 340 may be located on a rear surface of the display panel 310 to protect the display panel 310. For example, the lower protective film 340 may be coupled to the display panel 310 through a separate adhesive layer. The lower protective film 340 may prevent a scratch from being occurring on the rear surface of the display panel 310 during a manufacturing process. The lower protective film 340 may be a colored polyimide film.

According to some embodiments, a cushion member may be further provided under the lower protective film 340. The cushion member may protect the display panel 310 from an impact transferred from a lower portion. An impact resistance property of the display device 300 may be improved by the cushion member.

The lower member 350 may be located under the lower protective film 340. The lower member 350 may be attached to the lower protective film 340 by a separate adhesive layer. The lower member 350 may support configurations thereon.

The lower member 350 may include a first support member that may be provided in a form of an upper plate 351 and a second support member that may be provided in a form of a lower plate 352. The upper plate 351 and the lower plate 352 may be coupled by an adhesive layer 353.

The upper plate 351 may support configurations located thereon. The upper plate 351 may include a plurality of openings OP1 in the foldable area FA. The plurality of openings OP1 may overlap the foldable area FA. The upper plate 351 may be relatively easily deformed in the foldable area FA by the plurality of openings OP1.

The plurality of openings OP1 may pass through the upper plate 351 in a third direction D3. However, embodiments according to the present disclosure are not limited thereto. For example, the plurality of openings OP1 may form grooves by passing through only a portion of the upper plate 351.

According to some embodiments, the upper plate 351 may have a thickness less than that of the lower plate 352.

The lower plate 352 may be located under the upper plate 351 to support configurations located thereon. The lower plate 352 may include a plurality of bodies BD1 and BD2, and the plurality of bodies BD1 and BD2 may be located to be spaced apart from each other in the second direction DR2. For example, a first body BD1 of the lower plate 352 may be located in the first unfoldable area NFA1 to support configurations located thereon, and a second body BD2 of the lower plate 352 may be located in the second unfoldable area NFA2 and may support configurations located thereon.

Each of the first body BD1 and the second body BD2 may partially overlap the foldable area FA. The first body BD1 and the second body BD2 may be spaced apart from each other in the foldable area FA, but a width of a spaced space may be less than that of the foldable area FA. For example, the first body BD1 and the second body BD2 may overlap and support a portion where the openings OP1 of the upper plate 351 are located.

Each of the first body BD1 and the second body BD2 of the lower plate 352 may be attached to the upper plate 351 by the adhesive layer 353. For example, a first portion 353-1 of the adhesive layer 353 may couple the first body BD1 to the upper plate 351 in the first unfoldable area NFA1, and a second portion 353-2 of the adhesive layer 353 may couple the second body BD2 to the upper plate 351 in the second unfoldable area NFA2. The adhesive layer 353 may not overlap the foldable area FA.

According to some embodiments, the display device 300 may further include one or more functional layers under the lower plate 352. For example, a heat dissipation sheet and an insulating sheet may be located under the lower plate 352. The heat dissipation sheet may be a thermal conductive sheet having high thermal conductivity. The insulating sheet may be attached under the heat dissipation sheet. The insulating sheet may prevent rattle from occurring in the display device 300.

Figure 8:
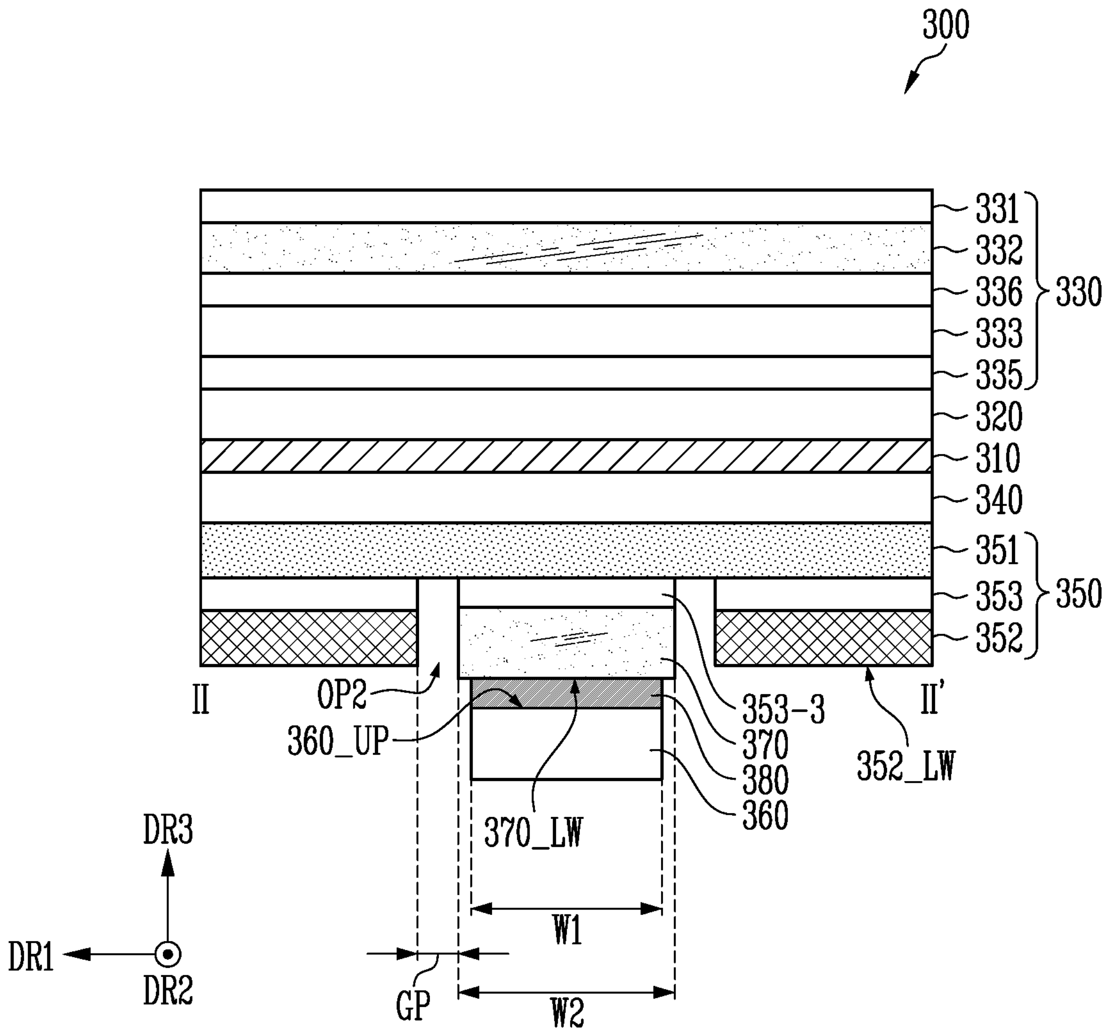
FIG. 8 is a cross-sectional view of the display device of FIG. 2 taken along a line II-II' of FIG. 2 according to some embodiments.
Figure 9:
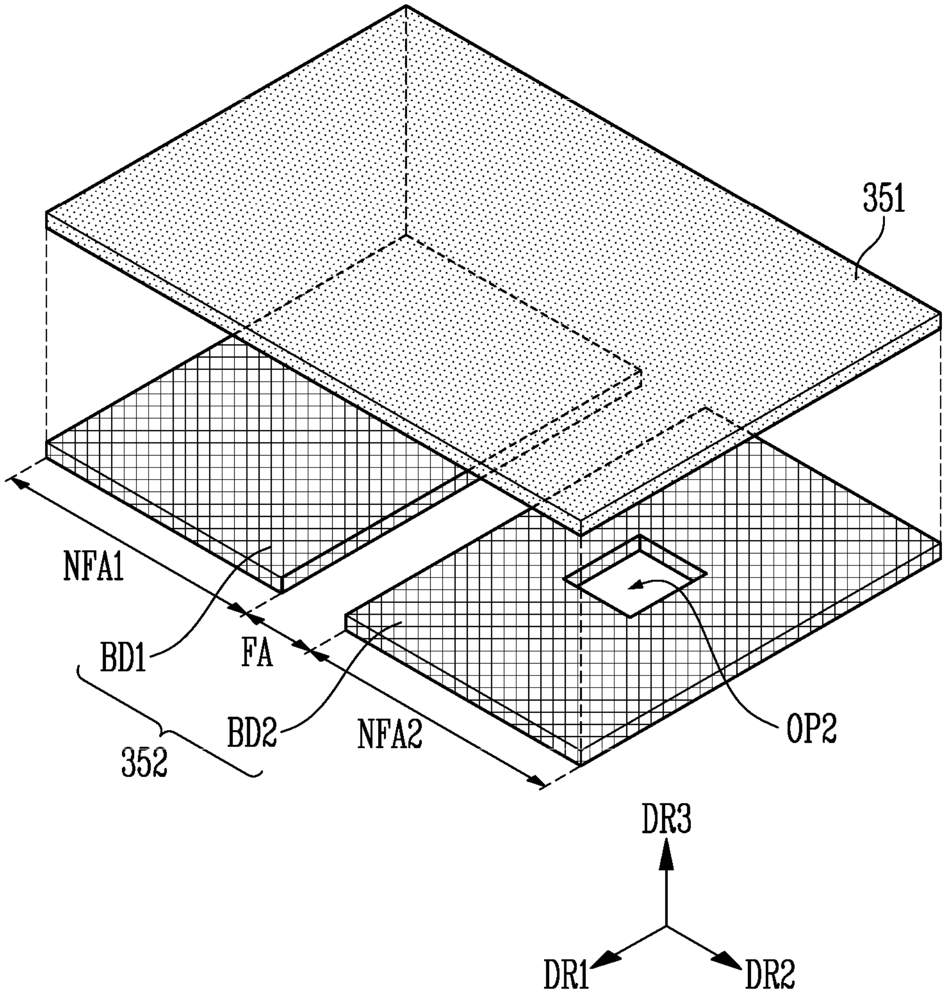
FIG. 9 is a perspective view illustrating an upper plate and a lower plate of FIG. 8 according to some embodiments.

FIG. 8 is a cross-sectional view of the display device of FIG. 2 taken along a line II-II' of FIG. 2 according to some embodiments. FIG. 9 is a perspective view illustrating an upper plate and a lower plate of FIG. 8 according to some embodiments.

Referring to FIG. 8, the display device 300 may include the display panel 310, the anti-reflection member 320, the upper member 330, the lower protective film 340, and the lower member 350.

The display device 300 may further include a fingerprint detection sensor 360 located in the second unfoldable area NFA2 of FIG. 2. The fingerprint detection sensor 360 may overlap the fingerprint detection area FSA of FIG. 2. The fingerprint detection sensor 360 has an active area capable of detecting the fingerprint FP of FIG. 2 of the user. The active area of the fingerprint detection sensor 360 may be an upper surface 360_UP of the fingerprint detection sensor 360.

The fingerprint detection sensor 360 may be an ultrasonic fingerprint sensor. The fingerprint detection sensor 360 may be configured to output ultrasonic signals through the upper surface 360_UP, detect ultrasonic signals received by reflecting the output ultrasonic signals on the fingerprint FP of the user, and detect the fingerprint FP of the user based on the detected ultrasonic signals.

According to some embodiments of the present disclosure, the lower plate 352 of the lower member 350 may include an opening OP2 overlapping the fingerprint detection sensor 360. Referring to FIG. 9 together with FIGS. 2 and 6, the lower plate 352 may include the first body BD1 overlapping the first unfoldable area NFA1 and the second body BD2 overlapping the second unfoldable area NFA2, and the second body BD2 may define the opening OP2. It may be understood that the opening OP2 of the second body BD2 defines the fingerprint detection area FSA.

Referring to FIG. 8 again, the display device 300 includes a reinforcing member 370 overlapping the opening OP2 of the lower plate 352 and located between the fingerprint detection sensor 360 and the upper plate 351. The reinforcing member 370 may be positioned in the opening OP2 of the lower plate 352 and may face the lower plate 352 in the first and second directions DR1 and DR2. The reinforcing member 370 may be spaced apart from the lower plate 352 with a gap GP interposed therebetween.

Signals output from the fingerprint detection sensor 360, for example, the ultrasonic signals, may deform at least a portion of layers configuring the display device 300. Such deformation may reduce reliability of an operation of the display device 300 and/or the display panel 310. In addition, when an upper layer of the display device 300 such as the cover window 332 is deformed, the deformation may be recognized by the user.

The reinforcing member 370 may be configured to prevent configurations of the display device 300 from being deformed by the signals output from the fingerprint detection sensor 360. The adhesive layer 353 may further include a third portion 353-3 overlapping the reinforcing member 370 together with the first and second portions 353-1 and 353-2 described with reference to FIG. 6. The reinforcing member 370 may be adhered to the upper plate 351 by the third portion 353-3 of the adhesive layer 353.

The fingerprint detection sensor 360 may be an ultrasonic fingerprint sensor. The reinforcing member 370 may include a material having a relatively low acoustic impedance to effectively pass the ultrasonic signals and a relatively high modulus so as not to be deformed by the ultrasonic signals. An acoustic impedance of a material may be proportional to a product of a density and a modulus. Therefore, it may be desirable for the reinforcing member 370 to include a material having a relatively high modulus and a relatively low density, and the material of the reinforcing member 370 may include glass.

In addition, a thickness of the reinforcing member 370 may be appropriately selected so as to be resistant to deformation due to the ultrasonic signals while effectively passing the ultrasonic signals. When the reinforcing member 370 has a thickness ranging from about 140 micrometers to about 250 micrometers, the reinforcing member 370 may be resistant to the deformation due to the ultrasonic signals while effectively passing the ultrasonic signals. For example, the reinforcing member 370 may have a thickness of about 210 micrometers. The reinforcing member 370 may have a thickness greater than that of the lower plate 352. According to some embodiments, a lower surface 370_LW of the reinforcing member 370 may have a height lower than that of a lower surface 352_LW of the lower plate 352.

According to some embodiments, the reinforcing member 370 may be formed of any one of a polymer material, metal, and ceramic.

The reinforcing member 370 may overlap the entire upper surface 360_UP of the fingerprint detection sensor 360, and may have the area greater than that of the fingerprint detection sensor 360 in the first and second directions DR1 and DR2. For example, when the fingerprint detection sensor 360 has a first width W1, the reinforcing member 370 may have a second width W2 greater than the first width W1, and thus the fingerprint detection sensor 360 may completely overlap the reinforcing member 370. Accordingly, the signals output from the fingerprint detection sensor 360 may pass through the reinforcing member 370 and may be transferred to layers located on the reinforcing member 370.

As described above, the reinforcing member 370 may prevent or minimize the configurations of the display device 300 from being deformed due to the signals of the fingerprint detection sensor 360 while efficiently transferring the signals output from the fingerprint detection sensor 360 in a direction (or DR3) facing the upper member 330.

The display device 300 may further include a copper thin film layer 380 located between the fingerprint detection sensor 360 and the reinforcing member 370. The copper thin film layer 380 may be directly located on the upper surface 360_UP of the fingerprint detection sensor 360. The copper thin film layer 380 may be provided to improve an ultrasonic recognition rate when the fingerprint detection sensor 360 is an ultrasonic fingerprint sensor. According to some embodiments, the entire upper surface 360_UP of the fingerprint detection sensor 360 may overlap the copper thin film layer 380. For example, the copper thin film layer 380 may have substantially the same area as the upper surface 360_UP of the fingerprint detection sensor 360.

The upper plate 351 may include a material capable of passing the ultrasonic signals while having relatively high rigidity. According to some embodiments, the upper plate 351 may include at least one selected from a group consisting of aluminum alloy, magnesium alloy, titanium alloy, carbon fiber reinforced plastics, and glass fiber reinforced plastics. A thickness of the upper plate 351 may be selected to be suitable for supporting configurations located thereon while effectively passing the ultrasonic signals.

In embodiments, the lower plate 352 may include at least one selected from a group consisting of stainless steel, aluminum alloy, and copper alloy. The lower plate 352 may not overlap the fingerprint detection sensor 360, and thus the lower plate 352 may be thicker than the upper plate 351 to be suitable for supporting configurations located thereon.

Figure 10:
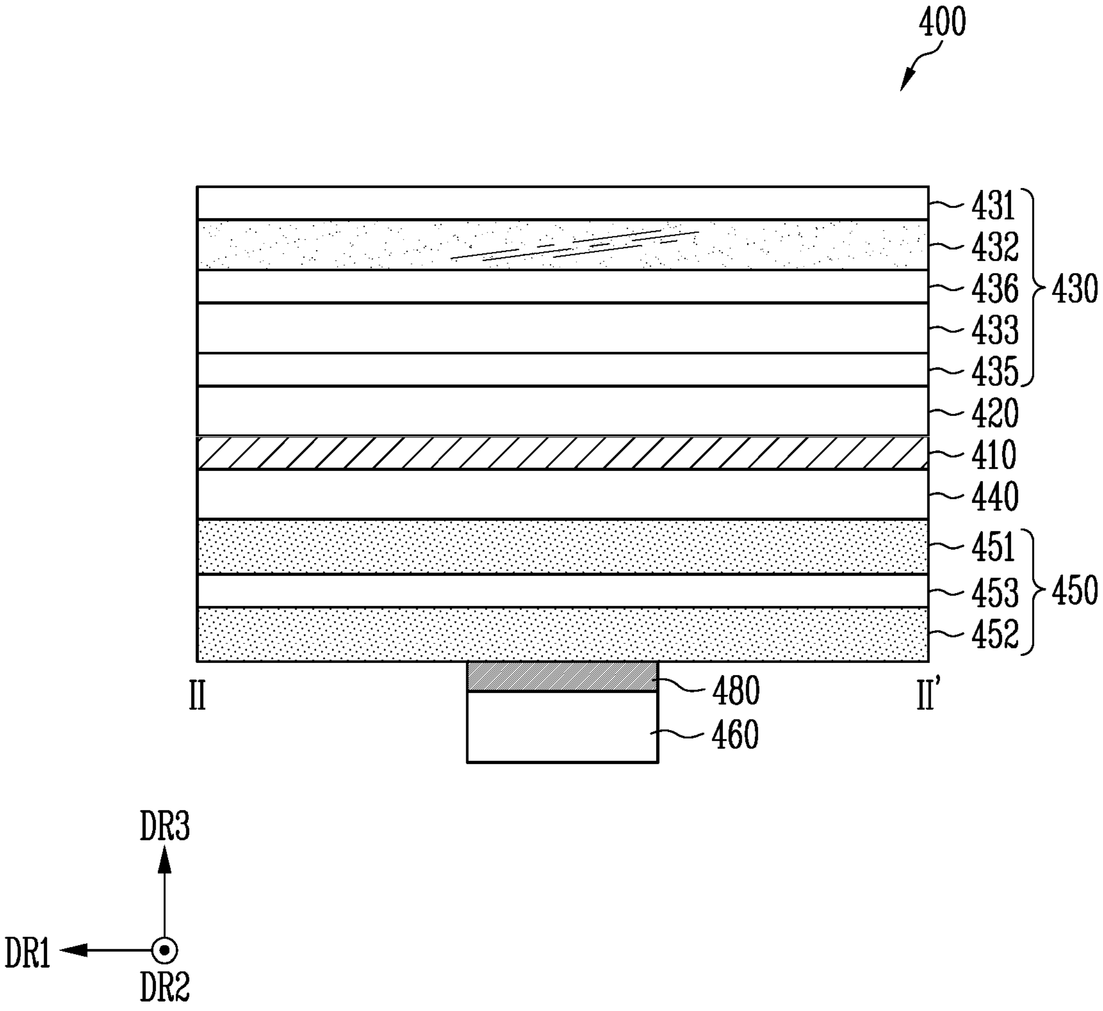
FIG. 10 is a cross-sectional view taken along the line II-II' of FIG. 2 of a display device according to some embodiments.
Figure 11:
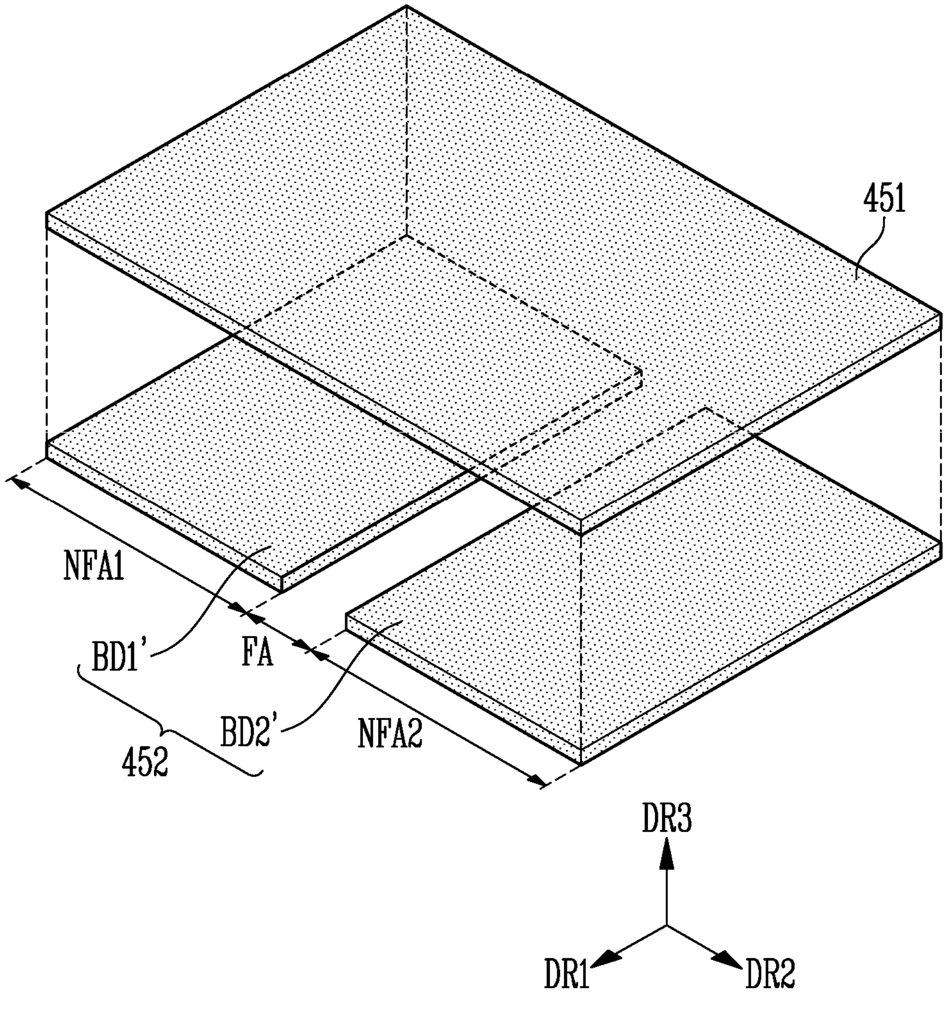
FIG. 11 is a perspective view illustrating an upper plate and a lower plate of FIG. 10 according to some embodiments.

FIG. 10 is a cross-sectional view taken along the line II-II' of FIG. 2 of the display device according to some embodiments. FIG. 11 is a perspective view illustrating an upper plate and a lower plate of FIG. 10 according to some embodiments.

Referring to FIG. 10, the display device 400 may include a display panel 410, an anti-reflection member 420, an upper member 430, a lower protective film 440, a lower member 450, a fingerprint detection sensor 460, and a copper thin film layer 480. The upper member 430 may include a protective layer 431, a cover window 432, an impact absorbing layer 433, and adhesive layers 435 and 436. The display panel 410, the anti-reflection member 420, the upper member 430, and the lower protective film 440 are configured similarly to the display panel 310, the anti-reflection member 320, the upper member 330, and the lower protective film 340 of FIG. 8, respectively. Hereinafter, an overlapping description is omitted.

The lower member 450 may include a first support member that may be provided in a form of an upper plate 451 and a second support member that may be provided in a form of a lower plate 452. The lower plate 452 may overlap the upper plate 451 and may be attached by an adhesive layer 453.

The fingerprint detection sensor 460 may be an ultrasonic fingerprint sensor. The fingerprint detection sensor 460 may be configured to output ultrasonic signals in a direction (for example, DR3) in a direction facing the upper member 430, detect ultrasonic signals received by reflecting the output ultrasonic signals on the fingerprint FP of the user, and detect the fingerprint FP of the user based on the detected ultrasonic signals.

According to some embodiments of the disclosure, the lower plate 452 may successively extend without an opening in an area overlapping the fingerprint detection sensor 460. Referring to FIG. 11 together with FIGS. 2 and 6, the upper plate 451 may successive extend in the first unfoldable area NFA1, the foldable area FA, and the second unfoldable area NFA2. The lower plate 452 may include a first body BD1' overlapping the first unfoldable area NFA1 and a second body BD2' overlapping the second unfoldable area NFA2. The first body BD1' and the second body BD2' may be spaced apart from each other in the foldable area FA. At this time, the lower plate 452 may not have an opening in an area overlapping the fingerprint detection area FSA. For example, the second body BD2' overlapping the fingerprint detection area FSA may not have an opening.

Referring to FIG. 10 again, the upper plate 451 and the lower plate 452 overlap the fingerprint detection sensor 460. Accordingly, the signals output from the fingerprint detection sensor 460 pass through not only the upper plate 451 but also the lower plate 452 and are transferred to other layers of the display device 400. As described above, the upper plate 451 and the lower plate 452 overlapping each other may prevent or minimize configurations of the display device 400, which are located on the upper plate 451 and the lower plate 452 from being deformed due to the signals of the fingerprint detection sensor 460, for example, ultrasonic signals.

Each of the upper plate 451 and the lower plate 452 may include a material capable of passing the ultrasonic signals while having relatively high rigidity. The upper plate 451 and the lower plate 452 may include the same material as each other. In embodiments, the upper plate 451 and the lower plate 452 may include aluminum alloy.

According to some embodiments, each of the upper plate 451 and the lower plate 452 may include at least one selected from a group consisting of aluminum alloy, titanium alloy, magnesium alloy, carbon fiber reinforced plastics, glass fiber reinforced plastics, and stainless steel. For example, the upper plate 451 and the lower plate 452 may be formed of different materials.

The copper thin film layer 480 may be located between the fingerprint detection sensor 460 and the lower plate 452. The copper thin film layer 480 may be provided to improve an ultrasonic recognition rate when the fingerprint detection sensor 460 is an ultrasonic fingerprint sensor.

Figure 12:
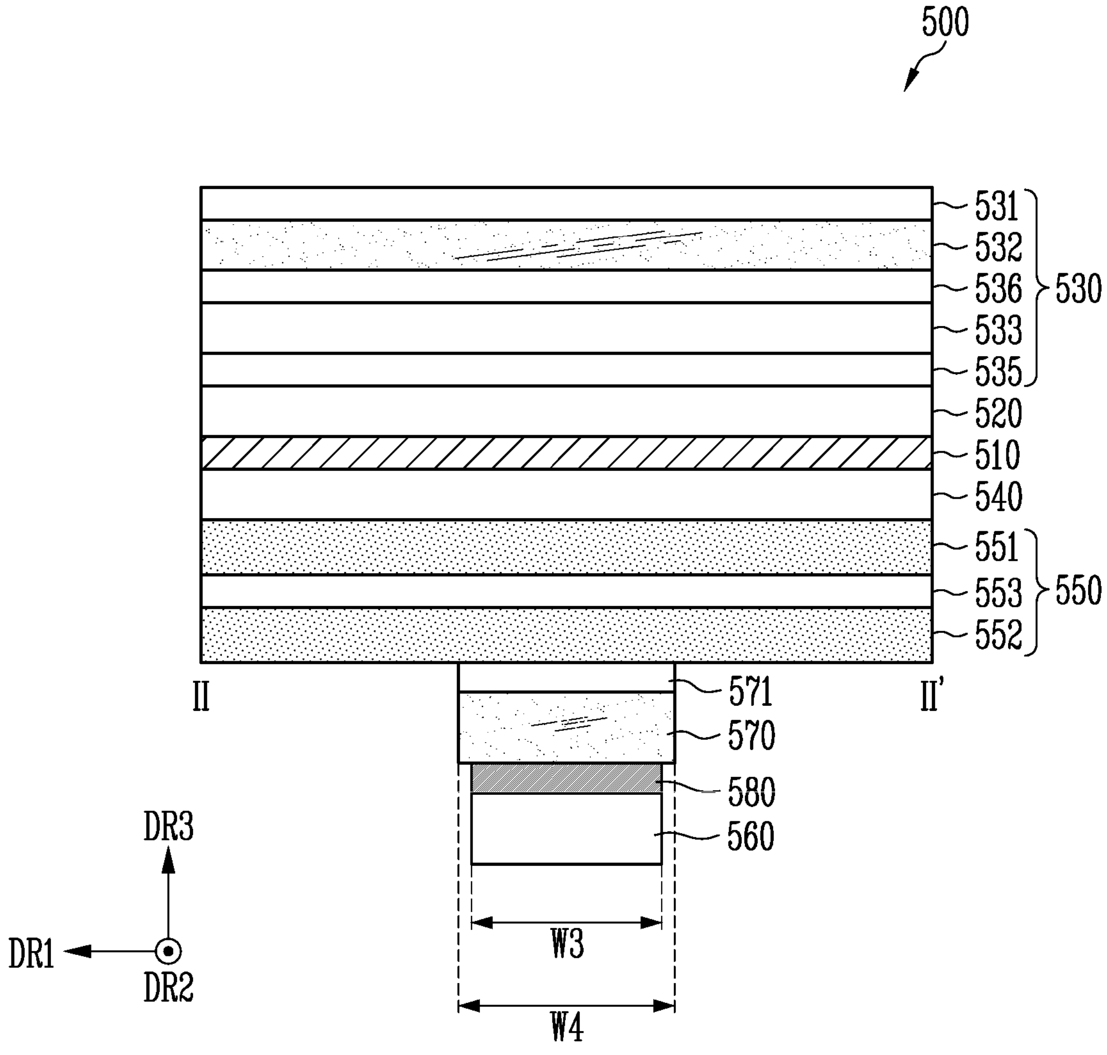
FIG. 12 is a cross-sectional view taken along the line II-II' of FIG. 2 of a display device according to some embodiments.

FIG. 12 is a cross-sectional view taken along the line II-II' of FIG. 2 of the display device according to some embodiments.

Referring to FIG. 12, the display device 500 may include a display panel 510, an anti-reflection member 520, an upper member 530, a lower protective film 540, a lower member 550, a fingerprint detection sensor 560, a reinforcing member 570, and a copper thin film layer 580. The upper member 530 may include a protective layer 531, a cover window 532, an impact absorbing layer 533, and adhesive layers 535 and 536. The display panel 510, the anti-reflective member 520, the upper member 530, the lower protective film 540, and the lower member 550 are configured similarly to the display panel 410, the anti-reflective member 420, the upper member 430, the lower protective film 440, and the lower member 450 of FIG. 10, respectively. Hereinafter, an overlapping description is omitted.

Compared to the display device 400 of FIG. 10, the display device 500 further includes a reinforcing member 570. The reinforcing member 570 may be located between the fingerprint detection sensor 560 and the lower member 550. For example, the reinforcing member 570 may be attached to the lower member 550 by an adhesive layer 571.

The reinforcing member 570 may include glass having a relatively low acoustic impedance to effectively pass ultrasonic signals output from the fingerprint detection sensor 560 and a relatively high modulus so as not to be deformed by the ultrasonic signals. Accordingly, the reinforcing member 570 may prevent at least a portion of the display device 500 from being deformed due to the signals output from the fingerprint detection sensor 560. The reinforcing member 570 may have a width W4 greater than a width W3 of the fingerprint detection sensor 560. The reinforcing member 570 may be configured similarly to the reinforcing member 370 of FIG. 8.

The copper thin film layer 580 may be located between the fingerprint detection sensor 560 and the lower member 550, and may be provided to improve an ultrasonic recognition rate when the fingerprint detection sensor 560 is an ultrasonic fingerprint sensor.

Although aspects of some embodiments of the present disclosure have been described with reference to some embodiments, those skilled in the art or those having a common knowledge in the art will understand that the disclosure may be variously modified and changed without departing from the spirit and technical area of the disclosure described in the claims which will be described later.

Therefore, the technical scope of the disclosure should not be limited to the contents described in the detailed description of the specification, but should be defined by the claims, and their equivalents.

What is claimed is:

1. A display device including unfoldable areas and a foldable area between the unfoldable areas, the display device comprising:

a window;

a display panel under the window;

a fingerprint detection sensor configured to generate signals for fingerprint recognition in a direction toward the display panel in any one of the unfoldable areas;

a first support member supporting the display panel under the display panel and between the display panel and the fingerprint detection sensor;

a second support member supporting the display panel under the first support member and having an opening overlapping the fingerprint detection sensor, wherein the first support member has a thickness less than a thickness of the second support member; and a reinforcing member in the opening of the second support member and separated from the second support member by a gap with a space of the gap immediately adjacent to an edge of the reinforcing member, the reinforcing member being between the first support member and the fingerprint detection sensor with the reinforcing member having a greater width than the fingerprint detection sensor, wherein the reinforcing member includes glass having a thickness greater than the thickness of the second support member.

2. The display device according to claim 1, wherein the fingerprint detection sensor includes an active area configured to generate the signals for the fingerprint recognition, and the reinforcing member overlaps the entire active area of the fingerprint detection sensor and has an area greater than an area of the active area.

3. The display device according to claim 1, wherein the first support member extends along an extension direction of the display panel without an opening overlapping the fingerprint detection sensor.

4. The display device according to claim 3, wherein the first support member and the second support member include materials different from each other.

5. The display device according to claim 3, wherein the first support member includes at least one selected from a group consisting of aluminum alloy, magnesium alloy, titanium alloy, carbon fiber reinforced plastics, and glass fiber reinforced plastics.

6. The display device according to claim 1, wherein the second support member includes bodies respectively overlapping the unfoldable areas, and the opening of the second support member is defined by one of the bodies and overlaps the reinforcing member.

7. The display device according to claim 6, wherein the bodies of the second support member include at least one selected from a group consisting of stainless steel, aluminum alloy, and copper alloy.

8. The display device according to claim 7, wherein the window includes ultra-thin glass having a thickness of 100 micrometers or less.

9. The display device according to claim 1, wherein the fingerprint detection sensor includes an ultrasonic fingerprint sensor configured to generate ultrasonic signals as the signals.

10. The display device according to claim 1, wherein the second support member extends in a first direction and a second direction crossing the first direction, the reinforcing member overlaps the fingerprint detection sensor in a third direction crossing the first and second directions, the third direction is the direction toward the display panel, and the reinforcing member faces a body of the second support member defining the opening in the first and second directions.

11. The display device according to claim 1, further comprising:

a copper thin film layer between the reinforcing member and the fingerprint detection sensor.

12. A display device including unfoldable areas and a foldable area between the unfoldable areas, the display device comprising:

a window;

a display panel under the window;

a fingerprint detection sensor configured to generate signals for fingerprint recognition in a direction toward the display panel in any one of the unfoldable areas;

a first support member supporting the display panel under the display panel and between the display panel and the fingerprint detection sensor;

a second support member supporting the display panel under the first support member and between the first support member and the fingerprint detection sensor, wherein the first support member has a thickness less than a thickness of the second support member, wherein the first support member and the second support member successively extend along an extension direction of the display panel without an opening in an area overlapping the fingerprint detection sensor;

a reinforcing member between the second support member and the fingerprint detection sensor with the reinforcing member having a greater width than the fingerprint detection sensor; and a copper thin film layer between the reinforcing member and the fingerprint detection sensor, wherein the fingerprint detection sensor is connected to the reinforcing member through the copper thin film layer, and wherein the reinforcing member includes glass having a thickness greater than the thickness of the second support member.

13. The display device according to claim 12, wherein the first support member and the second support member include a same material as each other.

14. The display device according to claim 12, wherein the first support member and the second support member include aluminum alloy.

15. The display device according to claim 12, wherein each of the first support member and the second support member includes at least one selected from a group consisting of aluminum alloy, titanium alloy, magnesium alloy, carbon fiber reinforced plastics, glass fiber reinforced plastics, and stainless steel.

16. The display device according to claim 12, wherein the second support member includes bodies respectively overlapping the unfoldable areas, and the fingerprint detection sensor overlaps one of the bodies.

17. The display device according to claim 12, wherein the fingerprint detection sensor includes an ultrasonic fingerprint sensor configured to generate ultrasonic signals as the signals.

18. A display device including unfoldable areas and a foldable area between the unfoldable areas, the display device comprising:

a window;

a display panel under the window;

an ultrasonic fingerprint sensor configured to generate ultrasonic signals in any one of the unfoldable areas in a direction toward the display panel;

a first support member supporting the display panel under the display panel and between the display panel and the ultrasonic fingerprint sensor;

a second support member supporting the display panel under the first support member and having an opening overlapping the ultrasonic fingerprint sensor, wherein the first support member has a thickness less than a thickness of the second support member; and a reinforcing member in the opening of the second support member and separated from the second support member by a gap with a space of the gap immediately adjacent to an edge of the reinforcing member and with the reinforcing member having a greater width than the ultrasonic fingerprint sensor, and the reinforcing member being between the first support member and the ultrasonic fingerprint sensor to prevent at least a portion of the display device from being deformed due to the ultrasonic signals, wherein the reinforcing member includes glass having a thickness greater than the thickness of the second support member.

* * * * *